US012621380B2

(12) United States Patent
Jin

(10) Patent No.: US 12,621,380 B2
(45) Date of Patent: May 5, 2026

(54) DISPLAY DEVICE

(71) Applicant: SAMSUNG DISPLAY CO., LTD., Yongin-si (KR)

(72) Inventor: Kyongbin Jin, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 905 days.

(21) Appl. No.: 17/723,082

(22) Filed: Apr. 18, 2022

(65) Prior Publication Data

US 2022/0240394 A1　　Jul. 28, 2022

Related U.S. Application Data

(63) Continuation of application No. 16/562,328, filed on Sep. 5, 2019, now Pat. No. 11,310,924.

(30) Foreign Application Priority Data

Oct. 11, 2018　(KR) ......................... 10-2018-0121157

(51) Int. Cl.
| | |
|---|---|
| *H04M 1/02* | (2006.01) |
| *G06F 1/16* | (2006.01) |
| *H10K 59/88* | (2023.01) |

(52) U.S. Cl.
CPC ........ *H04M 1/0266* (2013.01); *G06F 1/1626* (2013.01); *G06F 1/1637* (2013.01); *G06F 1/1684* (2013.01); *H10K 59/88* (2023.02)

(58) Field of Classification Search
CPC .......................... H04M 1/0266; H04M 1/0264
See application file for complete search history.

(56) References Cited

U.S. PATENT DOCUMENTS

| | | | |
|---|---|---|---|
| 9,437,132 B2 | 9/2016 | Rappoport et al. | |
| 10,178,311 B2 | 1/2019 | Jang et al. | |
| 2014/0176832 A1 | 6/2014 | Imazeki | |
| 2014/0197428 A1 | 7/2014 | Wang et al. | |
| 2015/0378060 A1 | 12/2015 | Kim et al. | |
| 2016/0276419 A1* | 9/2016 | Lim ................... | H10K 59/8722 |
| 2016/0372701 A1 | 12/2016 | Kwon et al. | |
| 2017/0068287 A1* | 3/2017 | Jung ........................ | G02B 1/111 |
| 2017/0098796 A1* | 4/2017 | Yee ...................... | H10K 59/871 |
| 2017/0148856 A1* | 5/2017 | Choi ..................... | H10K 59/873 |
| 2017/0205771 A1 | 7/2017 | Lin et al. | |
| 2017/0287992 A1 | 10/2017 | Kwak et al. | |
| 2018/0143503 A1 | 5/2018 | Moriwaki et al. | |
| 2018/0164850 A1 | 6/2018 | Sim et al. | |
| 2018/0183015 A1 | 6/2018 | Yun et al. | |

(Continued)

FOREIGN PATENT DOCUMENTS

| | | |
|---|---|---|
| CN | 106850897 A | 6/2017 |
| JP | 2014-134766 A | 7/2014 |

(Continued)

*Primary Examiner* — Ali Naraghi
(74) *Attorney, Agent, or Firm* — Womble Bond Dickinson (US) LLP

(57) ABSTRACT

A display device includes a window substrate having a top surface and a bottom surface, a display panel under the window substrate, an opening being defined in the display panel, a light blocking portion directly on the bottom surface of the window substrate and surrounding the opening when viewed from a plan view, and an electronic component overlapping with the opening.

11 Claims, 8 Drawing Sheets

(56)                      References Cited

U.S. PATENT DOCUMENTS

| | | |
|---|---|---|
| 2018/0219058 A1 | 8/2018 | Xiang et al. |
| 2018/0261661 A1 | 9/2018 | Jin |
| 2019/0037063 A1 | 1/2019 | Zeng |
| 2019/0071764 A1 | 3/2019 | Oh |
| 2019/0363141 A1* | 11/2019 | Ueno ..................... H10K 71/00 |
| 2019/0394373 A1 | 12/2019 | Zhang |
| 2020/0036823 A1* | 1/2020 | Hsieh .................. H04M 1/0266 |

FOREIGN PATENT DOCUMENTS

| | | |
|---|---|---|
| KR | 10-2012-0003322 A | 1/2012 |
| KR | 10-1251670 B1 | 4/2013 |
| KR | 10-2014-0005734 A | 1/2014 |
| KR | 10-2014-0105149 A | 9/2014 |
| KR | 10-2016-0002593 A | 1/2016 |
| KR | 10-1754075 B1 | 7/2017 |
| KR | 10-2017-0111827 A | 10/2017 |
| KR | 10-2018-0065722 A | 6/2018 |
| WO | WO 2018/161750 A1 | 9/2018 |

* cited by examiner

EA

100
PL
AD1
POL
AD2
200
400

DR3
DR2
DR1

DISPLAY DEVICE

CROSS-REFERENCE TO RELATED APPLICATIONS

This application is a continuation of U.S. patent application Ser. No. 16/562,328, filed Sep. 5, 2019, which claims priority to and the benefit of Korean Patent Application No. 10-2018-0121157, filed Oct. 11, 2018, the entire content of both of which is incorporated herein by reference.

BACKGROUND

1. Field

Aspects of the present disclosure relates to a display device having an expanded display area.

2. Description of the Related Art

A display device such as a smart phone or a tablet may display an image through a display area of a display panel. A bezel area (e.g., a non-display area) may exist around the display area. Signal lines for transmitting input/output signals to a screen may be located in the bezel area. The bezel area may be covered by a separate case, or the transparency of a window panel may be adjusted in such a way that the bezel area is not visible to a user. Due to the bezel area, a size (i.e., an area) of the display device may be larger than that of the display area. Various methods for reducing the bezel area in a limited size of a portable terminal have been studied to provide a larger screen to a user.

SUMMARY

Aspects of embodiments of the present disclosure are directed to a display device of which a display area is expanded.

According to some embodiments of the inventive concept, there is provided a display device including: a window substrate having a top surface and a bottom surface; a display panel under the window substrate, an opening being defined in the display panel; a light blocking portion directly on the bottom surface of the window substrate and surrounding the opening when viewed from a plan view; and an electronic component overlapping with the opening.

In some embodiments, the window substrate includes a transparent area and a non-transparent area adjacent to the transparent area, and a print layer in the non-transparent area is directly on the bottom surface of the window substrate.

In some embodiments, the display panel includes: a display area configured to display an image and overlapping with the transparent area; and a non-display area adjacent to the display area and overlapping with the non-transparent area, wherein the opening is defined in the display area.

In some embodiments, the display panel includes: a first display area; and a second display area protruding from the first display area in a first direction, the opening being defined in the second display area.

In some embodiments, a width of the first display area in a second direction intersecting the first direction is greater than a width of the second display area in the second direction.

In some embodiments, the light blocking portion has a circular ring shape.

In some embodiments, a plurality of transparent portions are defined in the light blocking portion.

In some embodiments, the electronic component includes a plurality of electronic components and the opening includes a plurality of openings, the openings overlap with and have one-to-one correspondence with the electronic components when viewed from a plan view, and the transparent portions overlap with and have one-to-one correspondence with the openings when viewed from a plan view.

In some embodiments, the display panel includes dummy pixels in an area adjacent to the opening.

In some embodiments, the dummy pixels include first dummy pixels and second dummy pixels, the first dummy pixels overlap with the light blocking portion when viewed from a plan view, and the second dummy pixels overlap with an area adjacent to the light blocking portion when viewed from a plan view.

In some embodiments, the opening is defined by a side surface of the display panel, and the light blocking portion overlaps with the side surface when viewed from a plan view.

In some embodiments, the electronic component is under the opening.

In some embodiments, the electronic component is in the opening.

According to some embodiments of the inventive concept, there is provided a display device including: a window substrate; a display panel under the window substrate and defining a first opening and a second opening adjacent to the first opening, and a light blocking portion on a bottom surface of the window substrate and surrounding the first opening and the second opening when viewed from a plan view.

In some embodiments, the window substrate comprises a transparent area and a non-transparent area adjacent to the transparent area, wherein the light blocking portion is in the transparent area.

In some embodiments, the display panel comprises: a display area configured to display an image and overlapping with the transparent area, and a non-display area adjacent to the display area and overlapping with the non-transparent area, wherein the first opening and the second opening are defined in the display area.

In some embodiments, the light blocking portion defines a first transparent portion that overlaps with the first opening when viewed from the plan view and a second transparent portion that overlaps with the second opening when viewed from the plan view.

In some embodiments, the display device further includes: a first electronic component overlapping with the first opening when viewed from the plan view and a second electronic component overlapping with the second opening when viewed from the plan view.

In some embodiments, the first transparent portion, the first opening, and the first electronic component are aligned with each other along a first axis, and the second transparent portion, the second opening, and the second electronic component are aligned with each other along a second axis parallel to the first axis.

In some embodiments, the first opening is defined by a first side surface of the display panel, and the second opening is defined by a second side surface of the display panel, and the light blocking portion overlaps with the first side surface and the second side surface when viewed from the plan view.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
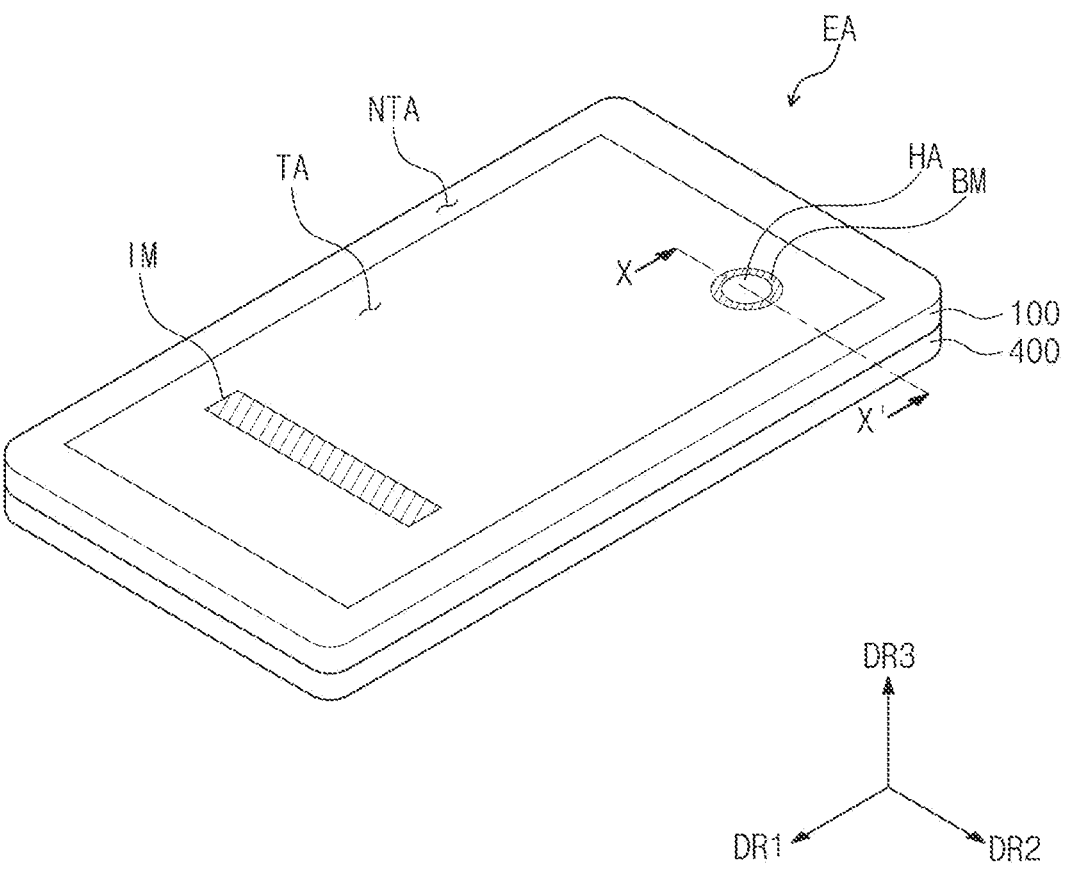
FIG. 1 is a perspective view illustrating a display device according to an embodiment of the inventive concept.

The inventive concept now will be described more fully hereinafter with reference to the accompanying drawings, in which various embodiments are shown. The inventive concept may, however, be embodied in many different forms, and should not be construed as limited to the embodiments set forth herein. Rather, these embodiments are provided so that this disclosure will be thorough and complete, and will fully convey the scopes of the inventive concept to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

Exemplary embodiments are described herein with reference to cross-sectional illustrations and/or plane illustrations that are idealized exemplary illustrations. In the drawings, the thicknesses of layers and regions may be exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Hereinafter, exemplary embodiments of the inventive concept will be described in detail with reference to the accompanying drawings.

Figure 2:
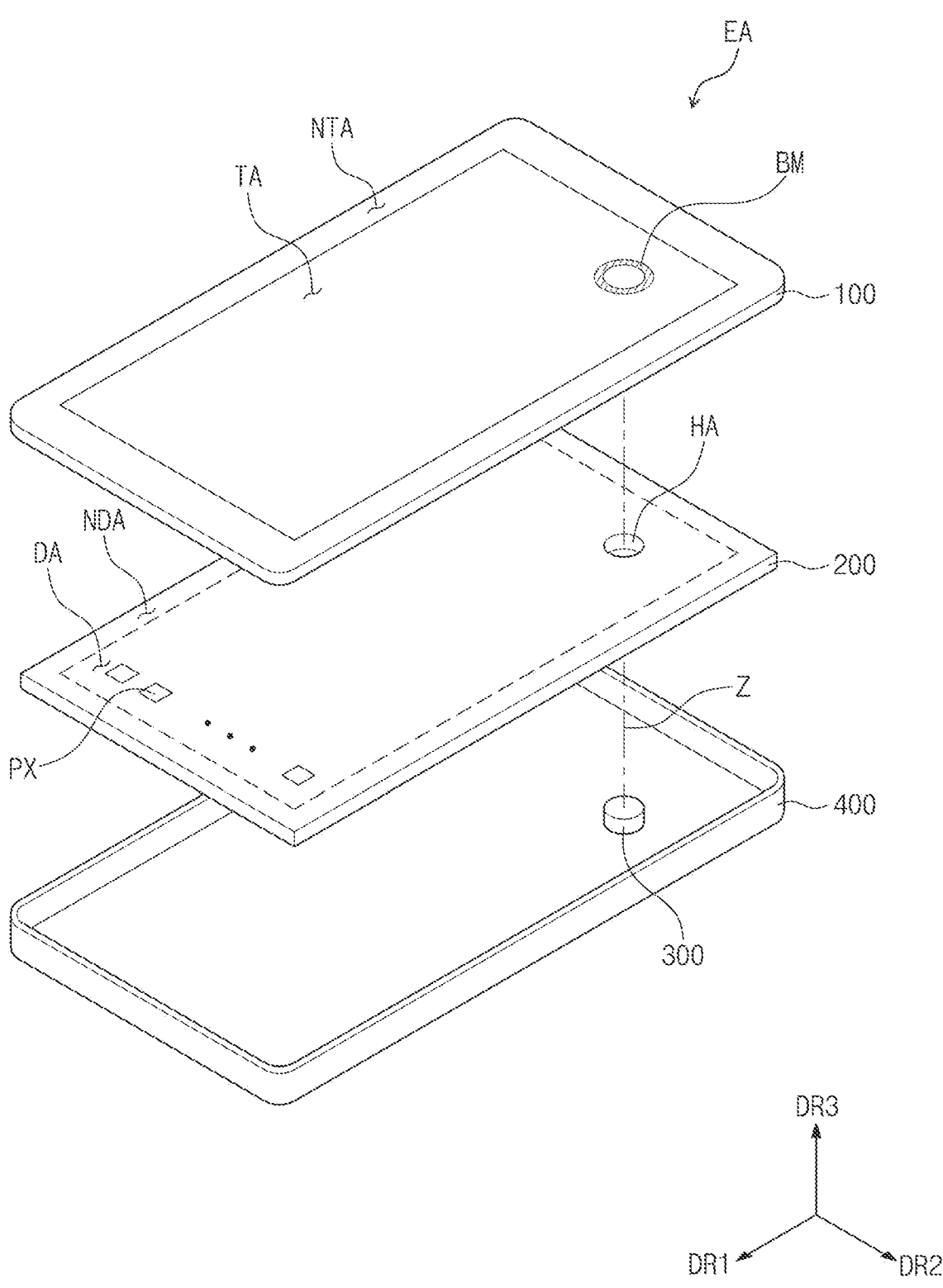
FIG. 2 is an exploded perspective view illustrating the display device of FIG. 1.

FIG. 1 is a perspective view illustrating a display device according to an embodiment of the inventive concept; and FIG. 2 is an exploded perspective view illustrating the display device of FIG. 1.

Referring to FIGS. 1 and 2, a display device EA may be activated by an electrical signal. The display device EA may be realized as various embodiments. For example, the display device EA according to the inventive concept may be used in large-sized electronic devices (e.g., televisions and monitors) and small and middle-sized electronic devices (e.g., portable phones, smart phones, tablets, car navigation units, game consoles, and smart watches). In the present embodiment, a smart phone is illustrated as an example of the display device EA.

As illustrated in FIG. 1, the display device EA may provide a display surface for displaying an image IM at its front surface. The display surface may be parallel to a plane defined by a first direction DR1 and a second direction DR2. The display surface may include a transparent area TA and a non-transparent area NTA adjacent to the transparent area TA.

The display device EA may display the image IM in the transparent area TA. In FIG. 1, an internet search box is illustrated as an example of the image IM. The transparent area TA may have a quadrilateral shape (e.g., a rectangular shape) parallel to the first and second directions DR1 and DR2. However, embodiments of the inventive concept are not limited thereto. In other embodiments, the shape of the transparent area TA may be variously modified in a suitable manner.

The non-transparent area NTA may be adjacent to the transparent area TA. The non-transparent area NTA may surround the transparent area TA when viewed from a plan view. However, embodiments of the inventive concept are not limited thereto. In other embodiments, the non-transparent area NTA may be disposed adjacent to only one side of the transparent area TA or may be omitted. In other words, the display device EA according to the inventive concept may be variously embodied and is not limited to a specific embodiment.

A direction perpendicular to the display surface may correspond to a thickness direction DR3 (hereinafter, referred to as a third direction DR3) of the display device EA. In the present embodiment, a front surface (or a top surface) and a rear surface (or a bottom surface) of each member may be defined by a direction (e.g., the third direction DR3) in which the image IM is displayed. The front surface and the rear surface may be opposite to each other in the third direction DR3.

However, directions indicated by the first to third directions DR1, DR2 and DR3 may be relative concepts and may be changed into other directions. Hereinafter, the first to third directions are the directions indicated by the first to third directions DR1, DR2 and DR3 illustrated in the drawings, respectively. In the present specification, a view (or a plane) defined by the first and second directions DR1 and DR2 may correspond to a plan view, and it may be understood that when one or more components are viewed from a plan view, it or they may be viewed in a direction opposite to the third direction DR3.

As illustrated in FIG. 2, the display device EA may include a window substrate 100, a display panel 200, an electronic component 300, and a receiving member 400.

In the present embodiment, the window substrate 100 may provide a front surface of the display device EA. The window substrate 100 may be disposed on a front surface of the display panel 200 to protect the display panel 200. For example, the window substrate 100 may include a glass substrate, a sapphire substrate, a plastic film, and/or the like. The window substrate 100 may have a single-layered or multi-layered structure. For example, the window substrate 100 may have a stack structure including a plurality of plastic films coupled to each other by an adhesive or may have a stack structure which includes a glass substrate and a plastic film coupled to each other by an adhesive.

The window substrate 100 may include the transparent area TA and the non-transparent area NTA. The transparent area TA may correspond to a display area DA of the display panel 200. For example, the transparent area TA may overlap with a whole or at least a portion of the display area DA. The image IM (see FIG. 1) displayed in the display area DA of the display panel 200 may be visible to the outside through the transparent area TA.

The non-transparent area NTA may define a shape of the transparent area TA. The non-transparent area NTA may be adjacent to the transparent area TA and may surround the transparent area TA in a plan view. The non-transparent area NTA may have a set or predetermined color. The non-transparent area NTA may cover a non-display area NDA of the display panel 200 to prevent the non-display area NDA from being visible to the outside. However, embodiments of the inventive concept are not limited thereto. In another embodiment of the inventive concept, the non-transparent area NTA may be omitted in the window substrate 100.

A light blocking portion BM may be disposed under the window substrate 100. The light blocking portion BM may be disposed directly on a bottom surface of the window substrate 100. The light blocking portion BM may surround an opening HA of the display panel 200 when viewed from a plan view. The light blocking portion BM may hide a side surface of the display panel 200, which defines the opening HA. In other words, the light blocking portion BM may hide an inner side surface of the opening HA. The light blocking portion BM may have a circular ring shape. However, embodiments of the inventive concept are not limited thereto. In other embodiments, the shape of the light blocking portion BM may be variously modified in a suitable manner. For example, the light blocking portion BM may have a quadrilateral ring shape or a polygonal ring shape.

The display panel 200 may include the display area DA and the non-display area NDA, which divide the display panel 200 when viewed from a plan view. The display area DA may be an area in which the image IM (see FIG. 1) is generated. The display panel 200 may include a pixel PX disposed in the display area DA. The pixel PX may be provided in plurality, and the plurality of pixels PX may be arranged in the display area DA. Lights generated from the pixels PX may together form the image IM (see FIG. 1). The display panel 200 may include at least one of various suitable display panels, such as a liquid crystal display panel, an organic light emitting display panel, a plasma display panel, an electrophoretic display panel, and an electrowetting display panel.

The non-display area NDA may be adjacent to the display area DA. The non-display area NDA may surround the display area DA when viewed from a plan view. A driving circuit and/or driving lines for driving the display area DA may be disposed in the non-display area NDA.

In an embodiment, a portion of the non-display area NDA of the display panel 200 may be bent. Thus, a portion of the non-display area NDA may face the front surface of the display device EA, and another portion of the non-display area NDA may face a rear surface of the display device EA. In some examples, the non-display area NDA may be omitted in the display panel 200 according to an embodiment of the inventive concept.

The opening HA may be defined in the display area DA. The opening HA may penetrate the display panel 200. The opening HA may have a cylindrical shape having a height in the third direction DR3. The opening HA may be surrounded by the display area DA. The opening HA may be spaced apart from the non-display area NDA with the display area DA interposed therebetween when viewed in a cross-sectional view. The display panel 200 according to an embodiment of the inventive concept may include at least one opening HA.

According to the embodiment of the inventive concept, since the opening HA is defined in the display panel 200, a separate space for disposing the electronic component 300 may be omitted. Thus, an area (or size) of the non-display area NDA may be reduced to realize the display device EA having a narrow bezel. In addition, when the electronic component 300 is received in the opening HA, a thin display device EA may be realized.

The electronic component 300 may include at least one of various suitable functional modules for operating the display device EA. The electronic component 300 may receive an external input transferred through the opening HA and/or may provide an output signal through the opening HA. For example, the electronic component 300 may include a camera, a proximity sensor, an infrared sensor and/or the like. However, the electronic component 300 is not limited thereto.

The light blocking portion BM, the opening HA and the electronic component 300 may be aligned with each other along an axis Z. The axis Z may be parallel to the third direction DR3.

The receiving member 400 may be coupled to the window substrate 100. The receiving member 400 may provide the rear surface of the display device EA. The receiving member 400 may be coupled to the window substrate 100 to define an inner space. The display panel 200, the electronic component 300, and various suitable components (e.g., a battery) may be received in the inner space.

The receiving member 400 may be formed of a material having relatively high rigidity. For example, the receiving member 400 may include a plurality of frames and/or plates, which are formed of glass, plastic, a metal, and/or the like. The receiving member 400 may stably protect the components of the display device EA received in the inner space from an external impact.

Figure 3:
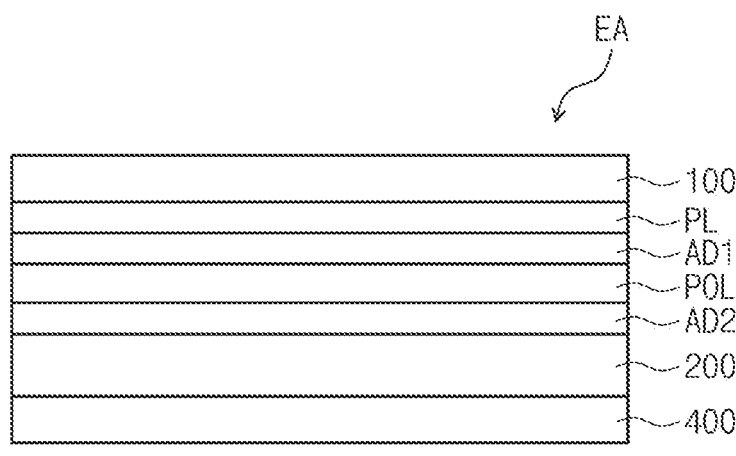
FIG. 3 is a cross-sectional view illustrating a display device according to an embodiment of the inventive concept.
Figure 3:
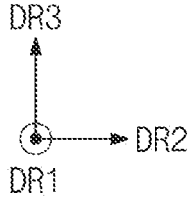

FIG. 3 is a cross-sectional view illustrating a display device according to an embodiment of the inventive concept. In FIG. 3, the same components as described with reference to FIGS. 1 and 2 will be indicated by the same reference numerals or designators, and the detailed descriptions thereto may not be repeated.

Referring to FIG. 3, the display device EA may include the window substrate 100, a print layer portion PL, a first adhesive portion AD1, a polarizing portion POL, a second adhesive portion AD2, the display panel 200, and the receiving member 400.

The print layer portion PL may be disposed on the bottom surface of the window substrate 100. The print layer portion PL may include a light blocking portion BM (see FIG. 4A) and a print layer PA (see FIG. 4A). The light blocking portion BM may be located on the same plane as the print layer PA. The print layer portion PL may have an opaque black color. However, embodiments of the inventive concept are not limited thereto. In other embodiments, the print layer portion PL may have at least one of other various suitable colors.

The first adhesive portion AD1 may be disposed on a bottom surface of the print layer portion PL. The first adhesive portion AD1 may adhere the print layer portion PL to the polarizing portion POL and may adhere the window substrate 100 to the polarizing portion POL. For example, the first adhesive portion AD1 may include an optically clear adhesive film, an optically clear resin, or a pressure sensitive adhesive film.

The polarizing portion POL may reduce reflection of external light to improve display quality.

The second adhesive portion AD2 may be disposed on a bottom surface of the polarizing portion POL. For example, the second adhesive portion AD2 may adhere the polarizing portion POL to the display panel 200. The second adhesive portion AD2 may be substantially the same as the first adhesive portion AD1. Thus, the descriptions to the second adhesive portion AD2 are omitted.

The receiving member 400 may be disposed under the display panel 200.

At least one lower functional layer may be disposed between the display panel 200 and the receiving member 400. The lower functional layer may include a functional layer for absorbing an impact, a functional layer for blocking light, a functional layer for assisting heat dissipation, and/or an electromagnetic interference (EMI) shielding layer for shielding against or blocking electromagnetic noise.

Figure 4A:
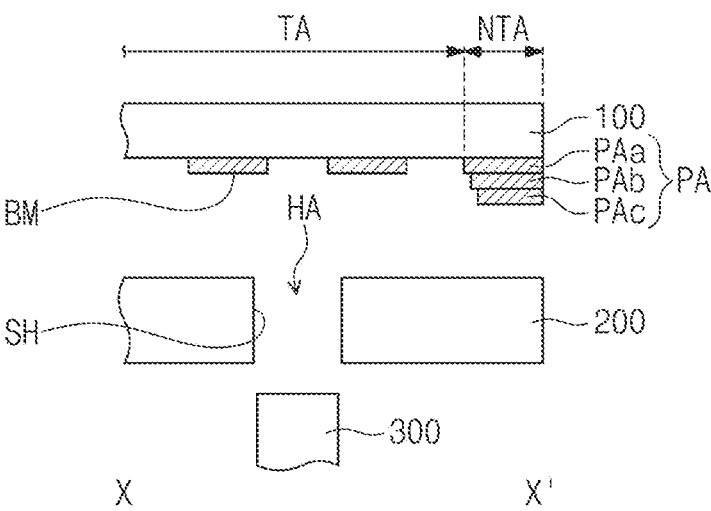
FIG. 4A is a cross-sectional view taken along the line X-X' of FIG. 1.
Figure 4B:
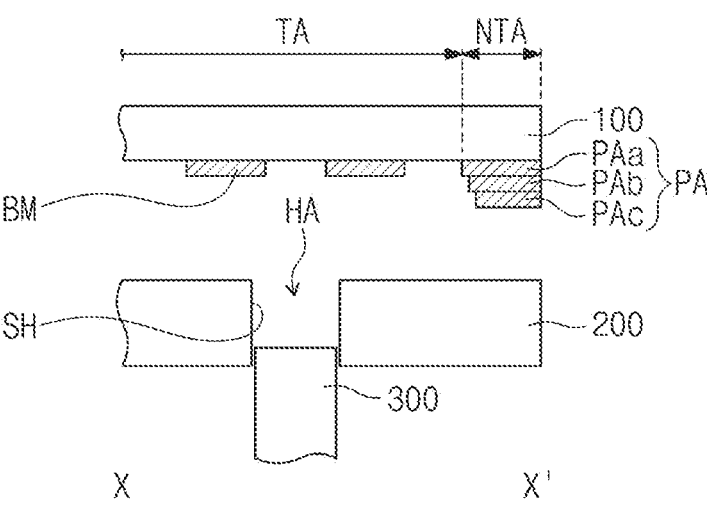
FIG. 4B is a cross-sectional view taken along the line X-X' of FIG. 1.

FIGS. 4A and 4B are cross-sectional views taken along the line X-X' of FIG. 1 to illustrate a display device according to some embodiments of the inventive concept. Hereinafter, the same components as described with reference to FIGS. 1 to 3 will be indicated by the same reference numerals or designators, and the descriptions thereto may be omitted for the purpose of ease and convenience in description.

Referring to FIGS. 4A and 4B, the print layer PA may be disposed on the bottom surface of the window substrate 100. For example, the non-transparent area NTA of the window substrate 100 may be defined by the print layer PA. The print layer PA may include a plurality of stacked print layers. In an embodiment, the print layer PA may include a first print layer PAa, a second print layer PAb, and a third print layer PAc. The first print layer PAa may be disposed on the same plane as the light blocking portion BM. However, embodiments of the inventive concept are not limited to the number of the layers of the print layer PA illustrated in FIGS. 4A and 4B. In other embodiments, the number of the layers of the print layer PA may be less or more than 3.

The light blocking portion BM may be formed by the same process as one of the first print layer PAa, the second print layer PAb, and the third print layer PAc. For example, the light blocking portion BM may be formed concurrently (e.g., simultaneously) with the first print layer PAa. Thus, the light blocking portion BM may include the same material as the first print layer PAa.

Referring to FIG. 4A, the electronic component 300 may be disposed under the opening HA.

Referring to FIG. 4B, the electronic component 300 may be disposed in the opening HA. The opening HA may be defined by a display panel boundary portion SH (e.g., a side surface) of the display panel 200. The electronic component 300 may be surrounded by the display panel boundary portion SH. Since the electronic component 300 is received in the opening HA, the thin display device EA (see FIG. 1) may be realized.

Figure 5:
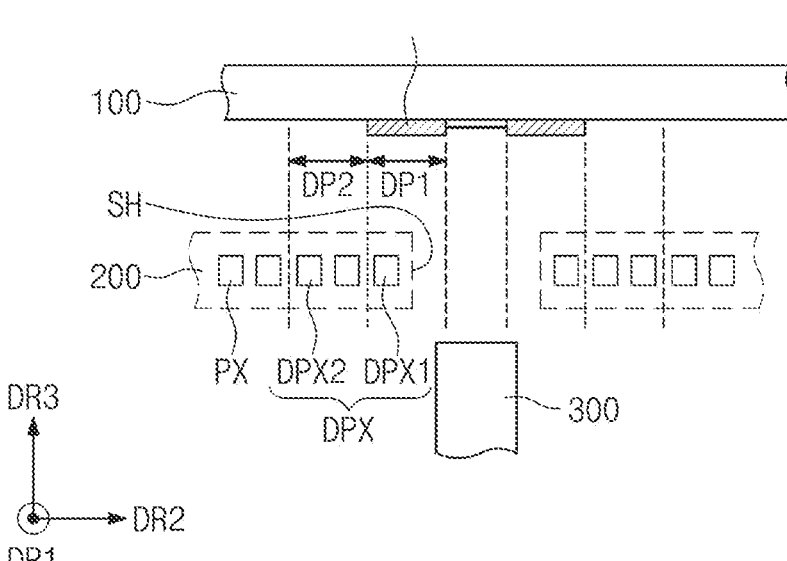
FIG. 5 is a cross-sectional view illustrating a display device according to an embodiment of the inventive concept.

FIG. 5 is a cross-sectional view illustrating a display device according to an embodiment of the inventive concept. Hereinafter, the same components as described with reference to FIGS. 1 to 4B will be indicated by the same reference numerals or designators, and the descriptions thereto may be omitted for the purpose of ease and convenience in description.

Referring to FIG. 5, the display panel 200 may include dummy pixels DPX disposed in an area adjacent to the display panel boundary portion SH. The dummy pixels DPX may include a first dummy pixel DPX1 and a second dummy pixel DPX2. The first dummy pixel DPX1 may be disposed in a first area DP1 that overlaps with the light blocking portion BM when viewed from a plan view. The second dummy pixel DPX2 may be disposed in a second area DP2 adjacent to the first area DP1. Thus, the second dummy pixel DPX2 may not overlap with the light blocking portion BM when viewed from a plan view. The dummy pixels DPX may be pixels that do not provide light. For example, the dummy pixels DPX may be black pixels.

Figure 6:
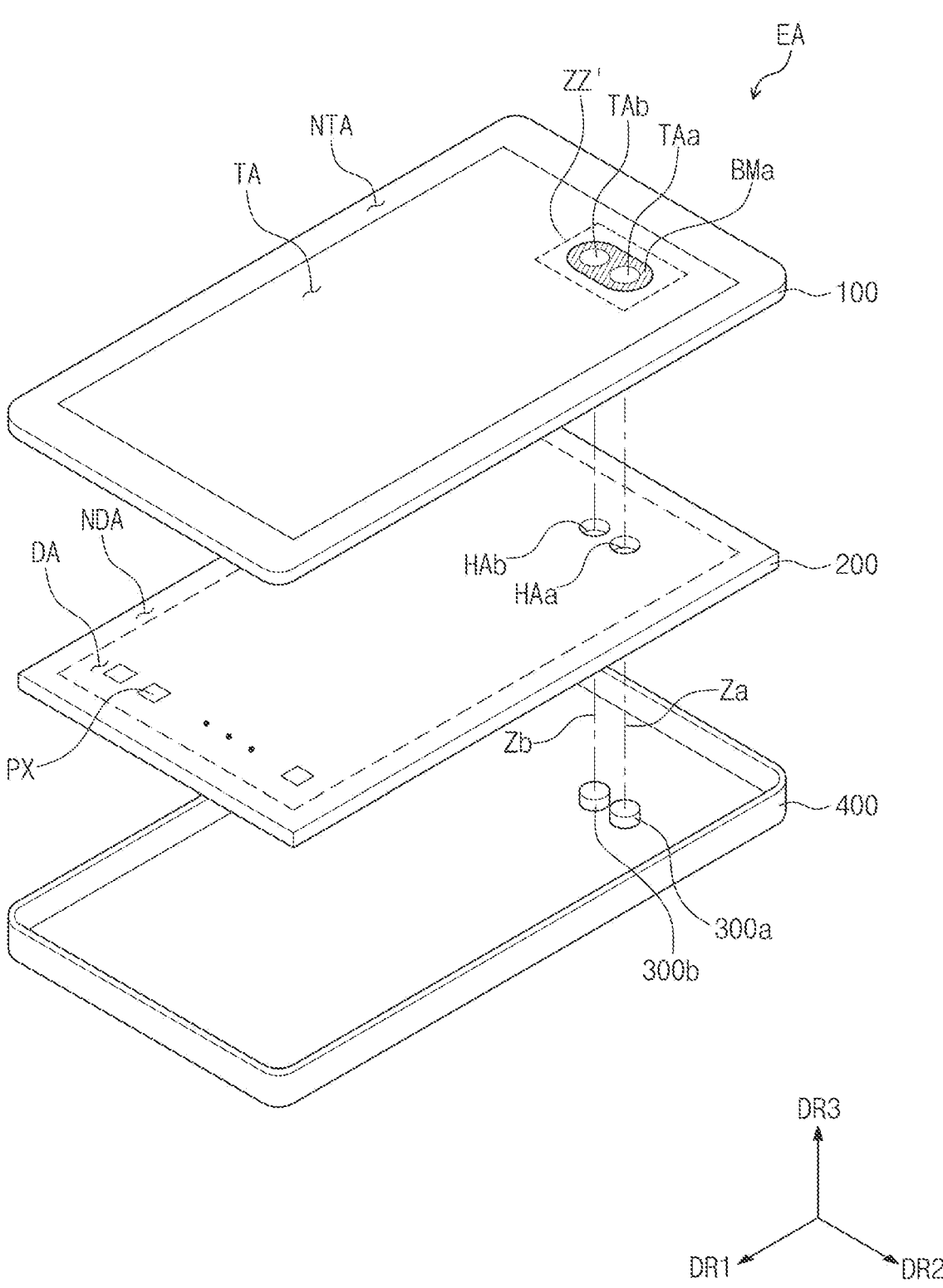
FIG. 6 is an exploded perspective view illustrating a display device according to an embodiment of the inventive concept.
Figure 7:
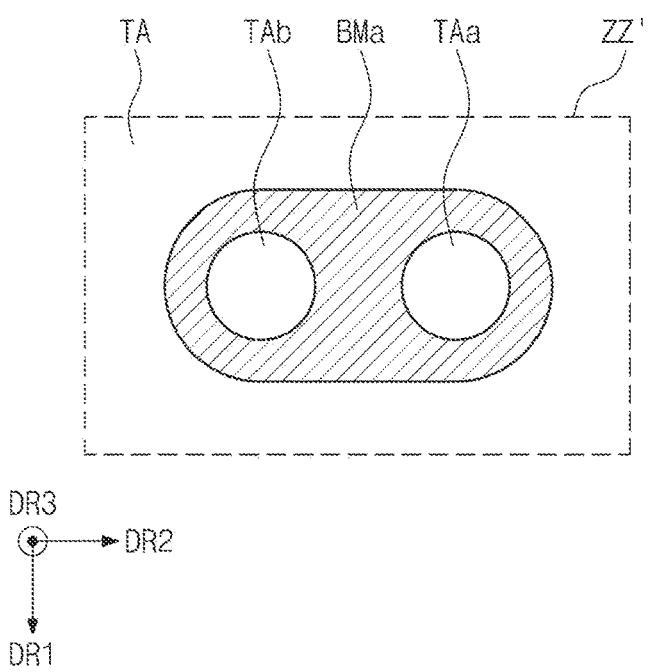
FIG. 7 is a plan view illustrating the area ZZ' of FIG. 6.

FIG. 6 is an exploded perspective view illustrating a display device according to an embodiment of the inventive concept, and FIG. 7 is a plan view illustrating the area ZZ' of FIG. 6. Hereinafter, the same components as described with reference to FIGS. 1 to 5 will be indicated by the same reference numerals or designators, and the descriptions thereto may be omitted for the purpose of ease and convenience in description.

Referring to FIGS. 6 and 7, a light blocking portion BMa may be disposed on the bottom surface of the window substrate 100. A first transparent portion TAa and a second transparent portion TAb may be defined in the light blocking portion BMa. A first opening HAa and a second opening HAb may be defined in the display panel 200. The first opening HAa and the second opening HAb may be defined in the display area DA of the display panel 200. The light blocking portion BMa may overlap with the display area DA when viewed from a plan view.

The first transparent portion TAa, the first opening HAa, and a first electronic component 300a may be aligned with each other along a first axis Za. The second transparent portion TAb, the second opening HAb, and a second electronic component 300b may be aligned with each other along a second axis Zb. The first axis Za and the second axis Zb may be parallel to the third direction DR3.

The first electronic component 300a and the second electronic component 300b may be functional modules. The first and second electronic components 300a and 300b may receive external inputs transferred through the first and second openings HAa and HAb, respectively, and/or may provide output signals through the first and second openings HAa and HAb, respectively. For example, each of the first and second electronic components 300a and 300b may include a camera, a proximity sensor, an infrared sensor, and/or the like. The first and second electronic components 300a and 300b may include the same functional module or may include different functional modules.

Two transparent portions TAa and TAb, two openings HAa and HAb, and two electronic components 300a and 300b are illustrated as an example in FIGS. 6 and 7. However, embodiments of the inventive concept are not limited to the numbers of the transparent portions TAa and TAb, the openings HAa and HAb and the electronic components 300a and 300b illustrated in FIGS. 6 and 7. In other examples, there may be three or more of transparent portions, openings, and electronic components.

Figure 8:
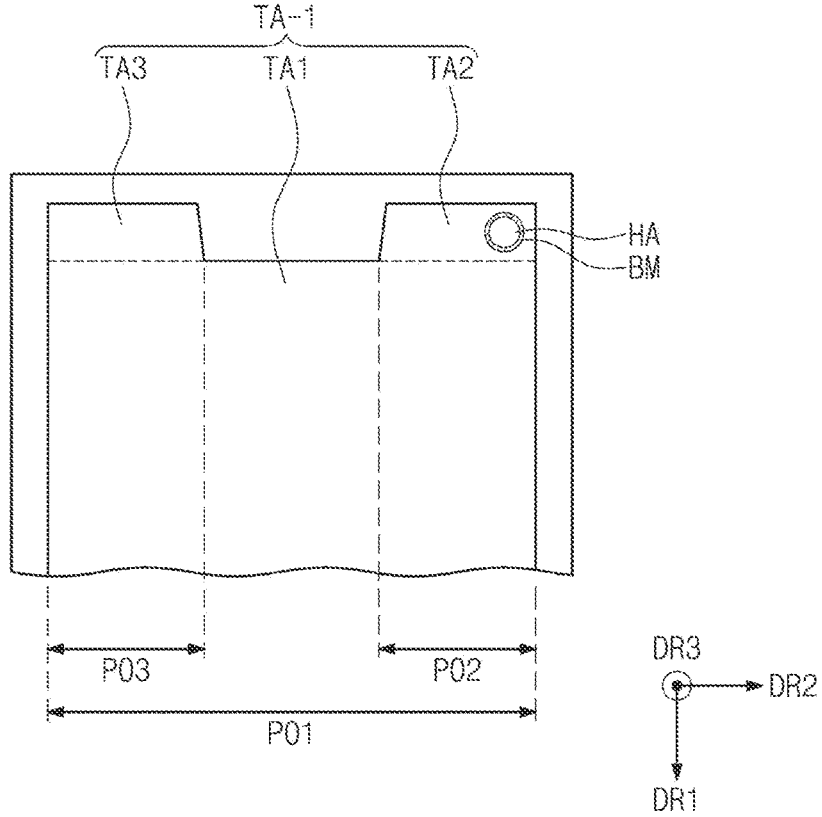
FIG. 8 is a plan view illustrating a display device according to an embodiment of the inventive concept.
Figure 9:
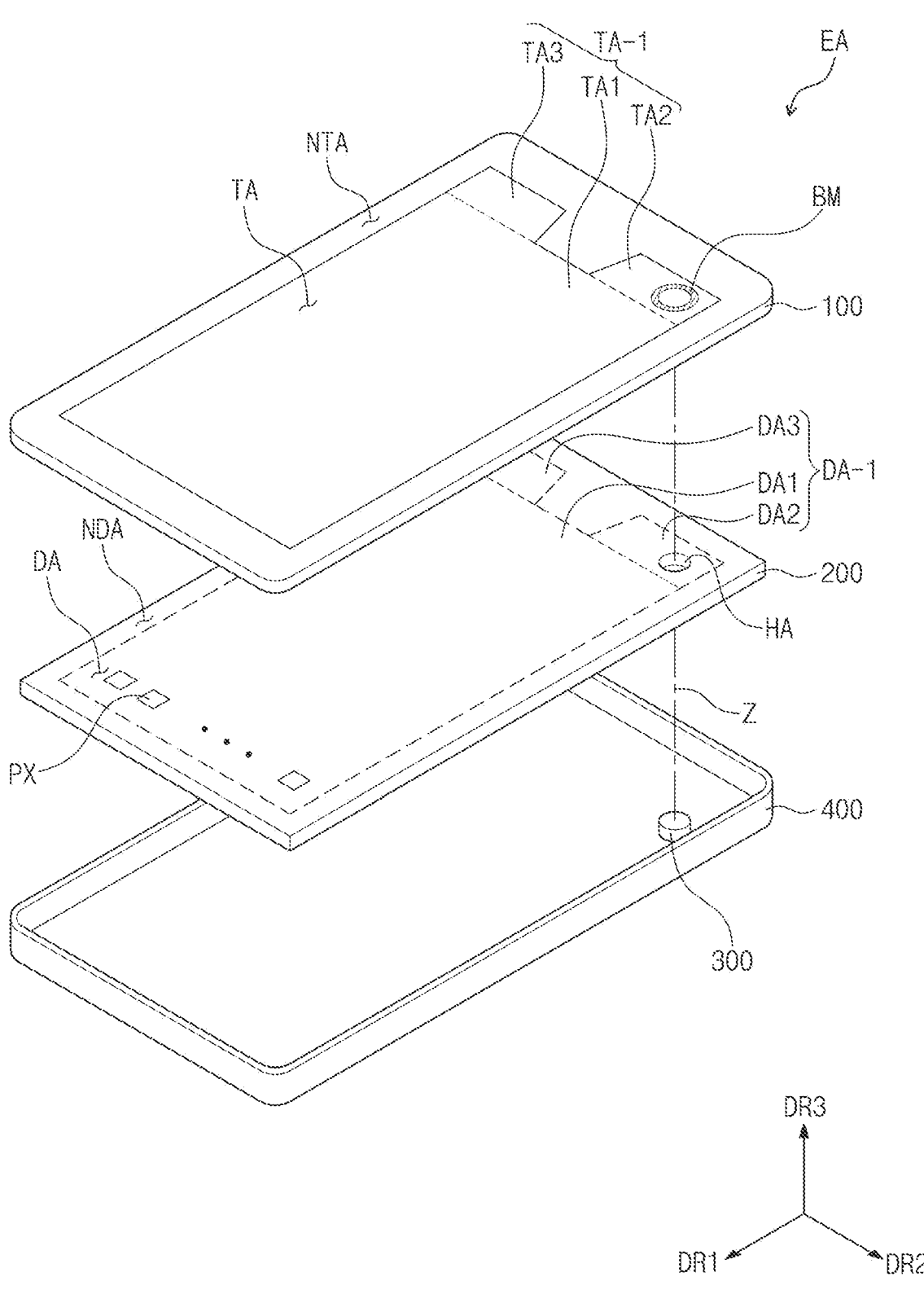
FIG. 9 is an exploded perspective view illustrating the display device of FIG. 8.

FIG. 8 is a plan view illustrating a display device according to an embodiment of the inventive concept, and FIG. 9 is an exploded perspective view illustrating the display device of FIG. 8. Hereinafter, the same components as described with reference to FIGS. 1 to 7 will be indicated by the same reference numerals or designators, and the descriptions thereto may be omitted for the purpose of ease and convenience in description.

Referring to FIGS. 8 and 9, a window substrate 100 may include a transparent area TA-1 which may include a first transparent area TA1, a second transparent area TA2, and a third transparent area TA3. Each of the second and third transparent areas TA2 and TA3 may protrude from the first transparent area TA1 in the first direction DR1. The second transparent area TA2 and the third transparent area TA3 may be spaced apart from each other in the second direction DR2. In another embodiment, one of the second transparent area TA2 and the third transparent area TA3 may be omitted.

A display panel 200 may include a display area DA-1 which may include a first display area DA1, a second display area DA2, and a third display area DA3. Each of the second and third display areas DA2 and DA3 may protrude from the first display area DA1 in the first direction DR1. The second display area DA2 and the third display area DA3 may be spaced apart from each other in the second direction DR2. In another embodiment, one of the second display area DA2 and the third display area DA3 may be omitted.

An opening HA may be defined in the second display area DA2. The opening HA may penetrate the display panel 200. The opening HA may have a cylindrical shape having a height in the third direction DR3. The opening HA may be surrounded by the second display area DA2. The display panel 200 according to an embodiment of the inventive concept may include at least one opening HA.

A light blocking portion BM may be disposed under the second transparent area TA2. The light blocking portion BM and the opening HA defined in the second display area DA2 may be aligned with each other in the third direction DR3 and may overlap with each other when viewed from a plan view.

A width PO1 of the first transparent area TA1 in the second direction DR2 may be greater than a width PO2 of the second transparent area TA2 in the second direction DR2 and a width PO3 of the third transparent area TA3 in the second direction DR2.

According to the embodiments of the inventive concept, since the opening HA is defined in the display panel 200, a separate space for disposing the electronic component 300 may be omitted. Thus, the area (or size) of the non-display area NDA may be reduced to realize the display device EA having a narrow bezel. In addition, when the electronic component 300 is received in the opening HA, the thin display device EA may be realized.

While the inventive concept have been described with reference to example embodiments, it will be apparent to those skilled in the art that various suitable changes and modifications may be made without departing from the spirits and scopes of the inventive concept. Therefore, it should be understood that the above embodiments are not intended to be limiting, but rather illustrative. Thus, the scopes of the inventive concept are to be determined by the broadest permissible interpretation of the following claims and their equivalents, and shall not be restricted or limited by the foregoing description.

What is claimed is:

1. A display device comprising:
a window substrate having a top surface and a bottom surface;
a display panel under the window substrate, an opening being defined in the display panel;
a light blocking portion directly on the bottom surface of the window substrate and surrounding the opening when viewed from a plan view; and
a print layer directly on the bottom surface of the window substrate and at a same plane as the light blocking portion, the print layer being separated from the light blocking portion by a gap in a plan view, wherein a plurality of transparent portions is defined in the light blocking portion, wherein the opening comprises a plurality of openings, and wherein the transparent portions overlap with and have one-to-one correspondence with the openings when viewed from the plan view.

2. The display device of claim 1, wherein the window substrate comprises a transparent area and a non-transparent area adjacent to the transparent area, and the print layer is in the non-transparent area.

3. The display device of claim 2, wherein the display panel comprises:

a display area configured to display an image and overlapping with the transparent area; and a non-display area adjacent to the display area and overlapping with the non-transparent area, wherein the plurality of openings is defined in the display area.

4. The display device of claim 1, wherein the display panel further comprises:

a first display area; and a second display area protruding from the first display area in a first direction, the plurality of openings being defined in the second display area.

5. The display device of claim 4, wherein a width of the first display area in a second direction intersecting the first direction is greater than a width of the second display area in the second direction.

6. The display device of claim 1, further comprising a plurality of electronic components overlapping with the plurality of openings respectively.

7. The display device of claim 6, wherein the plurality of electronic components dispose under the plurality of openings respectively.

8. The display device of claim 6, wherein the plurality of electronic components dispose in the plurality of openings respectively.

9. A display device comprising:

a window substrate having a top surface and a bottom surface;

a display panel under the window substrate, an opening being defined in the display panel;

a light blocking portion directly on the bottom surface of the window substrate and surrounding the opening when viewed from a plan view;

a print layer directly on the bottom surface of the window substrate and at a same plane as the light blocking portion, the print layer being separated from the light blocking portion by a gap in a plan view; and an electronic component overlapping with the opening, the electronic component being in the opening, wherein the electronic component comprises a camera.

10. The display device of claim 9, wherein the display panel comprises:

a display area configured to display an image; and a non-display area adjacent to the display area, wherein a plurality of openings is defined in the display area.

11. The display device of claim 9, wherein a plurality of transparent portions is defined in the light blocking portion, wherein the electronic component comprises a plurality of electronic components, and the opening comprises a plurality of openings, wherein the openings overlap with and have one-to-one correspondence with the electronic components when viewed from the plan view, and wherein the transparent portions overlap with and have one-to-one correspondence with the openings when viewed from the plan view.

* * * * *